United States Patent [19]

Miyajima

[11] Patent Number: 5,140,108
[45] Date of Patent: Aug. 18, 1992

[54] HOUSING FOR ELECTRONIC DEVICE

[75] Inventor: Hisashi Miyajima, Hino, Japan

[73] Assignee: Kabushiki Kaisha Toshiba, Kawasaki, Japan

[21] Appl. No.: 610,121

[22] Filed: Nov. 7, 1990

[30] Foreign Application Priority Data

Nov. 8, 1989 [JP] Japan .................. 1-288657

[51] Int. Cl.⁵ .................................. H05K 5/00
[52] U.S. Cl. ........................ 174/52.1; 174/52.4; 361/380; 361/212; 220/4.02
[58] Field of Search .............. 361/212, 220, 380, 395, 361/424; 174/50, 52.1, 52.4; 220/4.02

[56] References Cited

FOREIGN PATENT DOCUMENTS

55-47086 6/1981 Japan .
1-173981 12/1989 Japan .

*Primary Examiner*—Leo P. Picard
*Assistant Examiner*—Bot L. Ledynh
*Attorney, Agent, or Firm*—Finnegan, Henderson, Farabow, Garrett and Dunner

[57] ABSTRACT

An improved housing for an electronic device such as a small-sized portable communication device, comprising a case, a main cover and a sub cover, in which one portion of an opening of the case is covered with the main cover by engaging the main cover with the case and fixedly securing a screw portion of the main cover with the case by a screw, while the other portion of the opening of the case is covered with the sub cover by engaging the sub cover with the case and by engaging the sub cover with the main cover via elastic engaging portions provided in the sub cover thereby to cover the screw with the sub cover. According to this engagement, since the opening of the case is covered with the main cover and the sub cover, and the screw is entirely covered with the case, the screw is not exposed to the exterior of the housing so that the appearance of the housing can substantially be improved and undesirable introduction of electrostatics into the interior of the housing can be prevented reliably.

13 Claims, 5 Drawing Sheets

HOUSING FOR ELECTRONIC DEVICE

BACKGROUND OF THE INVENTION

1. Field of the Invention

The present invention relates generally to a housing for an electronic device such as a pager, a radio, a small-sized portable communication device or the like. More particularly, the present invention relates to an improvement of the housing for an electronic device in the form of an electronic circuit unit therein wherein the housing has an improved appearance and undesirable introduction of electrostatics into the interior of the housing is prevented substantially.

2. Description of the Related Art

Figure 6:
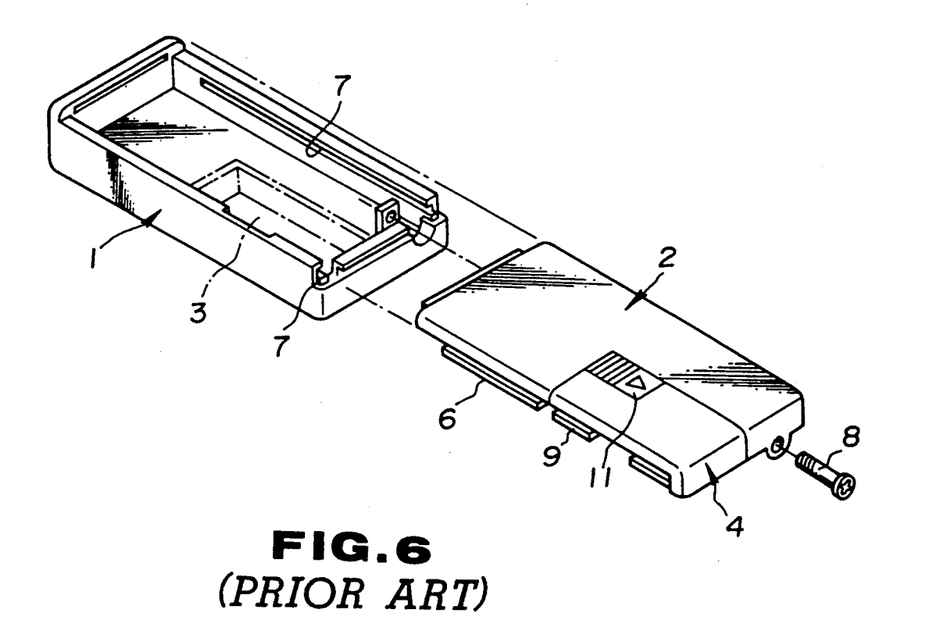
FIG. 6 is a perspective view which illustrates a conventional housing for accommodating an electronic device therein.

Hitherto, a housing of the foregoing type is usually required to have dimensions small enough to allow the housing to be received in a breast pocket on a user's suit. A typical conventional portable type housing is shown in FIG. 6 which is a perspective view illustrating a card box-shaped housing in a disassembled state.

The housing is molded of plastic material and includes as essential components a case 1 in which an electronic circuit unit (not shown) is accommodated, a cover 2 for closing a large part of the case 1 and a battery cover 4 for closing a battery receiving portion 3 of the case 1.

The cover 2 is formed with projections 6 outward of the both side edges thereof, and the projections 6 are fitted into guide grooves 7 on the inner surfaces of the both side walls of the case 1 and a screw 8 is screwed so that the cover 2 is firmly mounted at a predetermined position on the case 1.

The battery cover 4 is formed with projections outward of the both side edges thereof, and one projection 9 is fitted into a guide groove 7 on the case 1, while other projection (not shown) is fitted into a guide groove (not shown) on the cover 2, whereby the battery cover 4 is mounted at a predetermined position on the battery receiving portion 3. In addition, the battery cover 4 is formed with a locking portion (not shown) adapted to be engaged with a locking portion (not shown) on the cove 2. When the locking portion on the battery cover 4 is engaged with the locking portion on the cover 2, the battery cover 4 is firmly fitted to an assembly of the case 1 and the cover 2.

When the present dry battery is to be exchanged with another new one, a user depresses an opening/closing actuating portion 11 with his fingers so as to allow the battery cover 4 to be slidably displaced until only the battery cover 4 is removed from the assembly of the case 1 and the cover 2. In addition, when the electronic device accommodated in the housing is to be inspected, the cover 2 and the battery cover 4 are removed from the case 1 by unscrewing the screw 8.

With the conventional housing as constructed in the above-described manner, however, it has been found that the housing is unacceptable from the viewpoint of an appearance because the screw 8 is undesirably exposed to the outside.

Another problem of the conventional housing is that since the screw 8 is made of metallic material for the reason of assuring a sufficient mechanical strength for connecting the cover 2 to the case 1, an outside electrostatics is undesirably introduced into the interior of the housing via the screw 8, resulting in the electronic device such as an integral circuit or the like accommodated in the housing 1 erroneously operated. In an extreme case, the electronic device is damaged or destroyed by the electrostatics.

SUMMARY OF THE INVENTION

The present invention has been made with the foregoing background in mind.

An object of the present invention is to provide a housing for accommodating an electronic device therein wherein the housing has an excellent appearance.

Another object of the present invention is to provide a housing for accommodating an electronic device therein wherein undesirable introduction of outside electrostatics into the interior of the housing is prevented substantially.

To accomplish the above objects, the present invention provides a housing for an electric device, comprising a case for receiving an electronic unit, the case having an opening, a main cover for covering one portion of the opening and a sub cover for covering other portion of the opening, wherein the case has first engaging means, the main cover has second engaging means so that the first engaging means is engaged with the second engaging means, the main cover having a screw portion screwed on the case by a screw, and the sub cover has third engaging means so that the first engaging means is engaged with the third engaging means, the sub cover having elstic engaging means for engaging with the main cover, the sub cover covering at least the screw.

The main cover and the sub cover are arranged to come in contact with each other in the longitudinal direction of the case.

The first engaging means is a projection portion, the second engaging means is a groove portion and the third engaging portion is a groove portion.

Other objects, features and advantages of the present invention will become apparent from reading of the following description which has been made in conjunction with the accompanying drawings.

BRIEF DESCRIPTION OF THE DRAWINGS

The present invention is illustrated in the following drawings in which.

DESCRIPTION OF THE PREFERRED EMBODIMENT

Now, the present invention will be described in detail hereinafter with reference to the accompanying drawings which illustrate a preferred embodiment of the present invention.

FIG. 1 to FIG. 5 illustrate an elongated box-shaped housing for accommodating an electronic device therein in accordance with the embodiment of the present invention, respectively. Specifically, these drawings illustrate an example wherein the present invention is applied to an elongated box-shaped housing (hereinafter referred to simply as a housing) for accommodating a pager. In the drawings, reference numeral 20 generally designates a housing.

The housing 20 is molded of plastic material. As is best seen in FIG. 1, the housing 20 is composed of a case 21 having an opening exposed to the outside on one side thereof, a cover (main cover) 22 adapted to close a large part of the opening of the case 21 therewith and a battery cover (sub cover) 23 adapted to close a battery receiving portion 27 constituting a part of the opening of the case 21 therewith.

Figure 2:
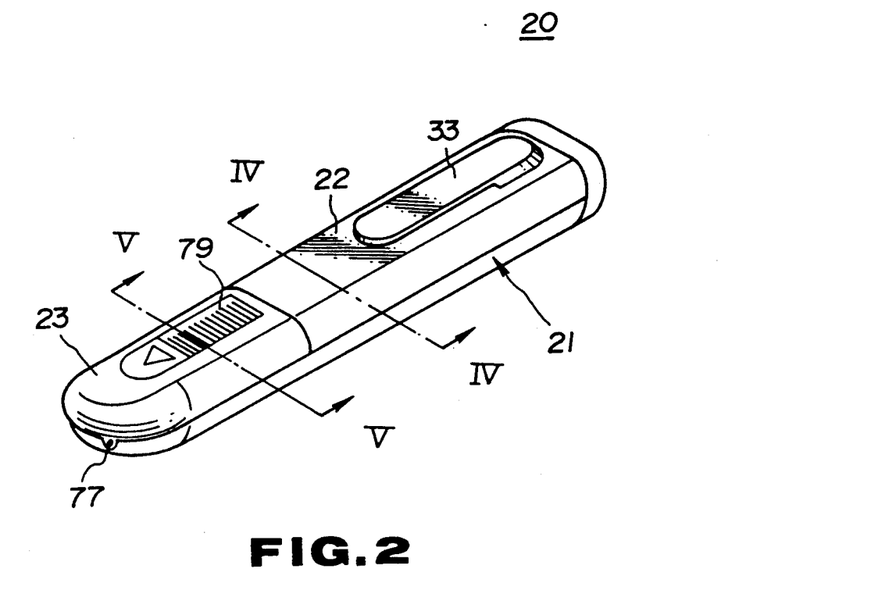
FIG. 2 is a perspective view which illustrates the housing in FIG. 1 in an assembled state.

As shown in FIG. 2, the housing 20 is designed in a longitudinally extending elongated configuration and has a very narrow width compared with the conventional housing which has been described above with reference to FIG. 6. This configuration makes it difficult to allow the housing 20 to be deformed when a twisting force is exerted on the housing 20 in the transverse direction to affect the fitted state wherein the both covers 22 and 23 are fitted to the case 21. Since a clip 33 is attached to the main cover 22, a user can carry the housing 20 by himself while the housing 20 is received in a breast pocket on his suit.

Figure 1:
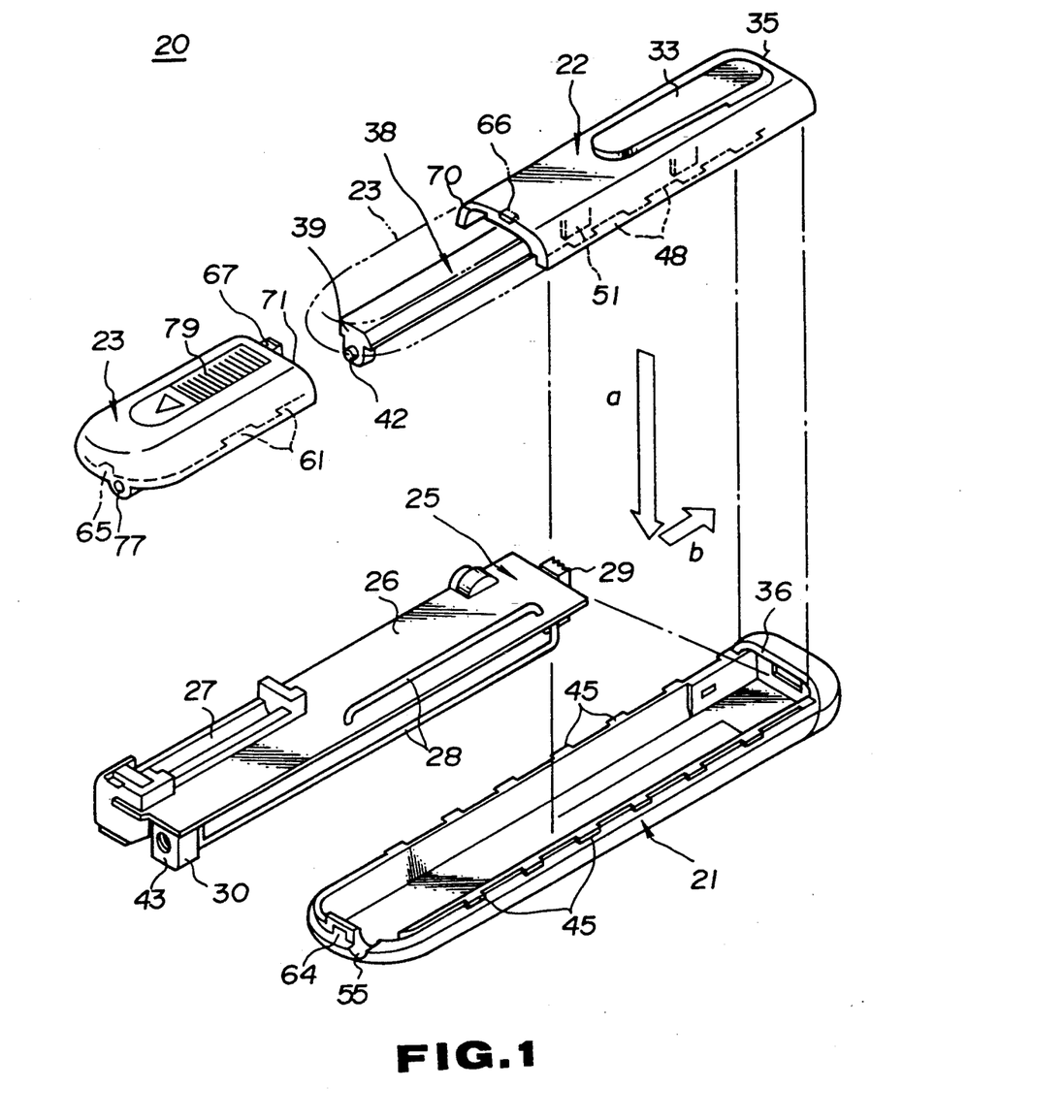
FIG. 1 is a perspective view which illustrates a housing for accommodating an electronic device therein in a disassembled state.

Referring to FIG. 1, an electronic circuit unit 25 to serve as an electronic device is shown in a disassembled state before it is accommodated in the case 21. The electronic circuit unit 25 is composed of various kinds of circuit sections which are mounted on an elongated printed circuit board 26.

The battery receiving portion 27 is fitted to the printed circuit board 26 along the edge of one long side of the same, while an antenna 28 is firmly mounted along the edge of other long side of the printed circuit board 26. In addition, a nut portion 30 is fitted to the printed circuit board 26 along the edge of one short side thereof.

The electronic circuit unit 25 is inserted into the case 21 from the slide switch 29 side so that it is accommodated in the case 21.

On the other hand, the cover 22 is fitted to the case 21 by placing the cover 22 on the case 21 in the a arrow-marked direction in FIG. 1, sliding the cover 22 in the b arrow-marked direction until a fore end surface 35 comes in contact with a front 36 of the case 21, and then threadably engaging a screw 42 on the rear end 39 of an extension portion (screw portion) 38 extending from the cover 22 in the rearward direction with a female-threaded hole 43 on the nut portion 30 of the electronic circuit unit 25. It should be noted that the b arrow-marked direction is hereinafter referred to as a forward direction and that the opposite direction to the b arrow-marked direction is hereinafter referred to as a rearward direction.

Figure 3:
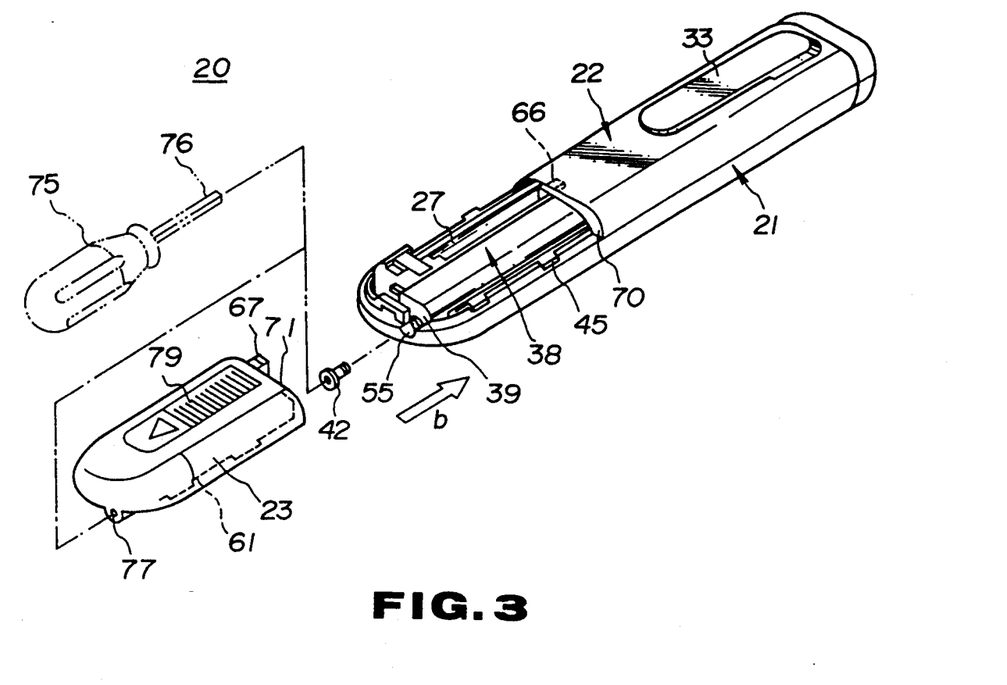
FIG. 3 is a perspective view which illustrates the housing having a battery cover removed therefrom.

The battery cover 23 connected to the cover 22 is fitted to the case 21, as represented by a two-dot chain line in FIG. 1. Alternatively, the battery cover 23 is fitted to the case body 21 to which the cover 22 has been fitted, as shown in FIG. 3.

Next, description will be made below as to a structure of each of the case 21, the cover 22 and the battery cover 23 as well as a manner of assembling them together.

As shown in FIG. 1, the case 21 is formed with a plurality of outward extending projections 45 along the edges of the both side walls with a predetermined distance between the adjacent projections 45. In addition, as shown in FIG. 4, the case 21 is formed with longitudinally extending grooves 46 between the edges of the both side walls and the projections 45.

On the other hand, the cover 22 is formed with a plurality of inward extending projections 48 along the edges of the both side walls with a predetermined distance between the adjacent projections 48. Each of the projections 48 is dimensioned to have a width wide enough to allow it to be received in the space between the adjacent projections 45 as well as a thickness thick enough to allow it to be inserted into the groove 46 on the case 21.

Figure 4:
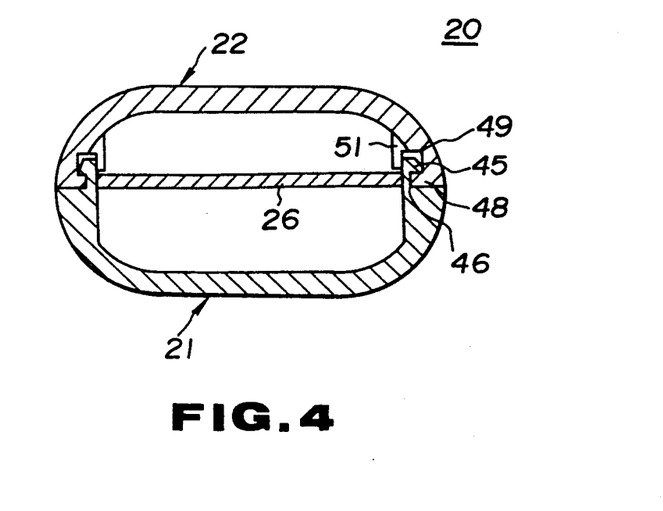
FIG. 4 is a cross-sectional view of the housing taken along line IV—IV in FIG. 2.

Additionally, as shown in FIG. 4, the cover 22 is formed with longitudinally extending grooves 49 on the inner surfaces of the both side walls, and each of the grooves 49 is dimensioned to have a width (as seen in the direction of height in the drawing) wide enough to allow the projection 45 on the case 21 to be engaged with the groove 49.

Thus, projections 45 on the case 21 constitutes first engaging means. The grooves 49 on the main cover 22 constitutes second engaging means.

Referring to FIG. 1 again, while each of the projections 48 is located between the adjacent projections 45 on the case 21, the cover 22 is fitted to the case body 21 in the a arrow-marked direction and thereafter it is slidably displaced in the b arrow-marked direction, whereby the projections 48 are inserted into the grooves 46 and the projections 45 are inserted into the grooves 49. Consequently, the cover 22 is firmly mounted on the case 21.

As shown in FIG. 4, the cover 22 is formed with guide portions 51 along the inner surfaces of the both side walls thereof so that edge portions of the both side walls of the case 21, i.e., the projections 45 on the both side walls of the case 21 are correctly held between the side walls of the cover 22 and the guides 51 in a clamped state.

With this construction, fitting of the cover 22 to the case 21, i.e., fitting of the projections 45 into the grooves 49 as well as fitting of the projections 48 into the grooves 46 are not broken or destroyed even if a large magnitude of outer force is exerted on the housing 20 in the direction of twisting the housing 20.

When the cover 22 is slidably displaced in the b arrow-marked direction in FIG. 1 until the fore end surface 35 of the cover 22 abuts against the front 36 of the case 21, the cover 22 is located to assume the position where one portion of the opening of the case 21 is fully closed with the cover 22.

In this state, the cover 22 is fixedly secured to the case 21 by engaging the nut portion 30 of the case 21 with the rear end 39 of the extension portion 38 by screwing a screw 42, as shown in FIG. 3. It should be added that the case 21 is formed with a recess 55 in the form of a semicircular cutout at the rear end thereof so as to allow the screw 42 to be easily threadably fitted into a hole in the rear end 39 of the extension portion 38.

The above-described construction of the housing 20 wherein the cover 22 is fitted to the case 21 in the a arrow-marked direction and thereafter it is slidably displaced in the b arrow-marked direction so that the cover 22 is mounted on the case 21 has an object which is intended to shorten a distance of slidably movement of the cover 22 in the b arrow-marked direction thereby to easily perform an assembling operation. It should be noted that alternative construction may be made such that the projections 45 and 48 and the grooves 46 and 49 are formed to extend linearly so that the cover 22 is mounted on the case 21 merely by slidably displace the cover 22 from the rear end of the case 21 in the b arrow-marked direction.

On the other hand, as shown in FIG. 1 and FIG. 3, the battery cover 23 is formed with a plurality of inwardly extending projections 61 along the edges of the both side walls thereof, and each of the projections 61 is dimensioned to have a width wide enough to allow it to be received between the adjacent projections 45 on the case 21 and a thickness thick enough to allow it to be inserted into the groove 46 on the case 21.

Figure 5:
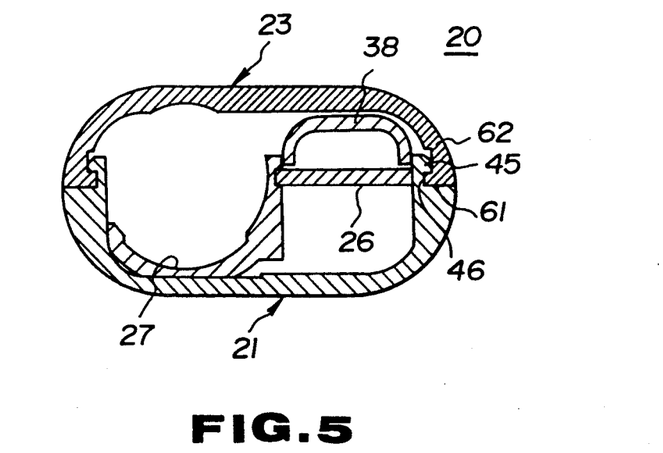
FIG. 5 is a cross-sectional view of the housing taken along line V—V in FIG. 2.

In addition, as shown in FIG. 5, the battery cover 23 is formed with grooves 62 on the inner surfaces of the both side walls thereof, and each of the grooves 62 is dimensioned to have a width (as seen in the direction of height in the drawing) wide enough to allow the projection 45 on the case 21 to be engaged with the groove 62.

Thus, the grooves 62 on the battery cover 23 constitutes third engaging means.

As shown in FIG. 1, the battery cover 23 is formed with an inward extending projection 65 on the rear side thereof which is adapted to be fitted into an aperture 64 in the shape of a rectangular hole on the case 21. Additionally, the battery cover 23 is formed with an outward extending projection (elastic engaging means) 67 on the fore side thereof which is adapted to be engaged with a locking recess (engaged portion) 66 on the cover 22. Thus, elastic engaging means is constituted by the recess 66 and the projection 67.

Referring to FIG. 3 and FIG. 5, when the projections 61 on the battery cover 23 are fitted into the grooves 46 on the case 21, the projections 45 on the case 21 are fitted into the grooves 62 on the cover 23 and the battery cover 23 is then slidably displaced in the b arrow-marked direction in FIG. 3 until the fore end surface 71 of the battery cover 23 abuts against the rear end surface 70 of the cover 22, the projection 67 is engaged with the recess 66 by elastic deformation of the projection 67. At the same time, the projection 65 on the battery cover 23 is inserted into the aperture 64 of the case 21 (see FIG. 1). Thus, the battery cover 23 is firmly fitted to the case 21.

On completion of the fitting operation of the battery cover 23 to the case 21, a part of the opening of the case 21 exclusive of the part of the case 21 which has been already closed with the cover 22 is closed with the battery cover 23. As a result, the extension portion 38 of the cover 22 and the screw 42 are closed with the battery cover 23.

As is apparent from FIG. 2, when a user practically uses the electronic device, the screw 42 made of metallic material for fixedly securing the cover 22 to the case 21 is fully received in the interior of the housing 20 which has been constructed by the case 21, the cover 22 and the battery cover 23 in the above-described manner. With this construction, there is no possibility that his fingers contact the screw 42 and thereby undesirable introduction of electrostatics into the interior of the housing 20 from the outside via the screw 42 can be prevented reliably. In addition, since the screw 42 is not exposed to the outside, the housing 20 has a good appearance. Another advantageous effect of the housing of the present invention is that since the location where the screw 42 is arranged can not visually be recognized by a third person based on the present appearance of the housing 20, there is no possibility that the housing 20 is forcibly opened by the third person who is intended to do mischief with the electronic device.

It should be added that the battery cover 23 is constructed such that it is supported by the cover 22, as represented by the two-dot chain line in FIG. 1.

Specifically, the battery cover 23 is held by the cover 22 by placing the battery cover 23 on the extension portion 38 of the cover 22, slidably displacing the battery cover 23 along the extension portion 38 serving as a guide until the fore end surface 71 of the battery cover 23 comes in contact with the rear end surface 70 of the cover 22 and then bringing the projection 67 in engagement with the locking recess 66.

Therefore, the cover 22 and the battery cover 23 can be mounted on the case 21 by locating the projections 48 and the projections 61 between the projections 61 and 61 so as to place the both covers 22 and 23 on the case 21 in the a arrow-marked direction and then slidably displacing the both covers 22 and 23 in the b arrow-marked direction thereby to fit the projections 48 into the grooves 46, the projections 45 into the grooves 49, the projections 61 into the grooves 46 and the projections 45 into the grooves 62.

Naturally, the both covers 22 and 23 can be dismounted from the case 21 by way of the inverse steps to the foregoing ones while the both covers 22 and 23 are integrally jointed to each other.

To assure that the both covers 22 and 23 are mounted on and dismounted from the case 21 while they are jointed to each other, it is required that the screw 42 for fixedly securing the cover 22 to the case 21 is screwed from the outside of the battery cover 23. To meet the requirement, a hole 77 for allowing the foremost end of a tool 75 to be inserted therethrough to screw the screw 42 is formed at the rear end of the battery cover 23, as shown in FIG. 3. In the shown embodiment, a screw having a hexagonal hole formed thereon is employed for the screw 42. Since the foremost end 76 of the tool 75 for the screw 42 is dimensioned to have a small diameter corresponding to the hole on the head portion of the screw 42 and thereby the hole 77 is required to have a small diameter, there is no possibility that an appearance of the housing 20 is degraded substantially.

When a new battery is to be received in the housing 20, e.g., for a pager as constructed in the above-described manner, a user first depresses a finger contact portion 79 of the battery cover 23 toward the case 21 side thereby to disengage the projection 67 from the recess 66. Then, he slidably displaces the battery cover 23 in the opposite direction to the b arrow-marked direction thereby to remove it from the case 21. Thus, the battery receiving portion 27 is exposed to the outside. Now, he is ready to place the new battery in the battery receiving portion 27.

On the other hand, in a case where the cover 22 and the battery cover 23 are removed from the case 21 for the purpose of inspecting the pager, he inserts the foremost end 76 of the tool 75 through the hole 77 to unscrew the screw 42. This makes it possible to remove from the case 21 an assembly of the cover 22 and the battery cover 23 jointed to each other in the above-described manner. Naturally, the assembly of the both covers 22 and 23 can fixedly be fitted to the case 21 by way of the inverse steps to those mentioned above. In this manner, mounting/dismounting operations of the both covers 22 and 23 can very easily be performed for the purpose of inspection.

According to the aforementioned embodiment of the present invention, the battery cover 23 is formed with the hole 77 through which the tool 75 is inserted to remove the assembly of the cover 22 and the battery cover 23 from the case 21 for the purpose of inspection. In a case where alternative arrangement is made such that mounting/dismounting operations are performed for the same purpose by removing the battery cover 23 and then removing the cover 22, formation of the hole 77 is not required. In this case, since the housing 20 exhibits an appearance having no hole formed thereon, the appearance of the housing 20 can substantially be improved and moreover undesirable introduction of electrostatics into the interior of the housing 20 from the outside can be prevented reliably.

The extension portion 38 is not always required. The screw 42 may be provided at the rear end of the main cover 22. The female-threaded hole 43 is formed with the corresponding area of the electronic circuit unit 25 so that the same effect as mentioned above is obtained.

The first engaging means is not always provided at the edges of the opening. The first engaging means may be provided with the forward end 36.

While the present invention has been described above with respect to the embodiment wherein the pager is employed as an electronic device, it should of course be understood that the present invention should not be limited only to the pager but it may equally be applied to a radio, a small-sized portable communication device or the like.

What is claimed is:

1. In a housing for an electronic device comprising a case for receiving an electronic unit, said case having an opening, a main cover for covering one portion of said opening, a sub cover for covering other portion of said opening, the improvement wherein
said case has first engaging means;
said main cover has second engaging means so that said first engaging means is engaged with said second engaging means, said main cover having a screw portion screwed on said case by a screw; and
said sub cover has third engaging means so that said first engaging means is engaged with said third engaging means, said sub cover having elastic engaging means for engaging with said main cover, said sub cover covering at least said screw.

2. The housing as claimed in claim 1, wherein said main cover and said sub cover are arranged to come in contact with each other in the longitudinal direction of said case.

3. The housing as claimed in claim 1, wherein said first engaging means is a projection portion, said second engaging means is a groove portion and said third engaging means is a groove portion.

4. The housing as claimed in claim 1, wherein said first engaging means is arranged along the edges of said opening.

5. The housing as claimed in claim 3, wherein said projection portion comprises a plurality of projections which are arranged in the longitudinal direction of said housing with a predetermined distance.

6. The housing as claimed in claim 3, wherein said main cover has guide portions on the inner surfaces of both side walls of the main cover, each of said guide portions being located such that said projection portions of said case are clamped between said guide portion and said side wall of said main cover.

7. The housing as claimed in claim 1, wherein said elastic engaging means comprises an elastic projection, said main cover having a recess, said projection being engaged with said recess.

8. The housing as claimed in claim 1, wherein said screw portion is formed such that said screw portion extends in said other portion of said opening of said case which has been closed with said sub cover.

9. The housing as claimed in claim 1, wherein said screw has a recess portion formed at a head portion thereof so as to allow the foremost end of a tool to be engaged with said recess portion.

10. The housing as claimed in claim 9, wherein said sub cover is formed with a hole through which said tool is inserted so as to allow the foremost end of the tool to be engaged with said recess portion of said screw.

11. The housing as claimed in claim 1, wherein the sub cover covers said screw and said screw portion.

12. In a housing for an electronic device comprising a case for receiving an electronic unit, said case having an opening, a main cover for covering one portion of said opening and a sub cover for covering other portion of said opening, the improvement wherein
said case has first engaging means arranged along the edges of said opening;
said main cover has second engaging means so that said first engaging means is slidably engaged with said second engaging means, said main cover having a screw portion to be screwed on said case by a screw; and
said sub cover has third engaging means so that said first engaging means is slidably engaged with said third engaging means, said cover having elastic engaging means for engaging with said main cover, said sub cover covering at least said screw so that said screw is not touched said screw.

13. The housing as claimed in claim 12, wherein said screw portion extends in the direction of slidable movement of said sub cover relative to said main cover to support said sub cover, said main cover having a recess, said elastic engaging means engaging with said recess so that said sub cover is engaged with said main cover.

* * * * *

UNITED STATES PATENT AND TRADEMARK OFFICE
CERTIFICATE OF CORRECTION

PATENT NO. : 5,140,108
DATED : August 18, 1992
INVENTOR(S) : Hisashi Miyajima

It is certified that error appears in the above-identified patent and that said Letters Patent is hereby corrected as shown below:

Claim 12, column 8, line 49, after "touched" delete "said screw".

Signed and Sealed this

Twenty-second Day of February, 1994

Attest:

BRUCE LEHMAN

*Attesting Officer*  *Commissioner of Patents and Trademarks*